United States Patent [19]
Quoirin

[11] Patent Number: 6,031,254
[45] Date of Patent: *Feb. 29, 2000

[54] MONOLITHIC ASSEMBLY OF AN IGBT TRANSISTOR AND A FAST DIODE

[75] Inventor: Jean-Baptiste Quoirin, Tours, France

[73] Assignee: SGS-Thomson Microelectronics S.A., Gentilly, France

[*] Notice: This patent issued on a continued prosecution application filed under 37 CFR 1.53(d), and is subject to the twenty year patent term provisions of 35 U.S.C. 154(a)(2).

[21] Appl. No.: 08/900,432

[22] Filed: Jul. 25, 1997

[30] Foreign Application Priority Data

Jul. 26, 1996 [FR] France ................................ 96/09680

[51] Int. Cl.[7] .................... H01L 29/74; H01L 29/732; H01L 29/872
[52] U.S. Cl. .................... 257/155; 257/146; 257/140; 257/341; 257/476
[58] Field of Search .................... 257/130, 139, 257/140, 146, 155, 378, 341, 476

[56] References Cited

U.S. PATENT DOCUMENTS

| | | | |
|---|---|---|---|
| 3,328,651 | 6/1967 | Miller | 257/496 |
| 5,072,312 | 12/1991 | Schwarzbauer | 257/496 |
| 5,183,769 | 2/1993 | Rutter et al. | 437/31 |
| 5,273,917 | 12/1993 | Sakurai | 437/40 |
| 5,338,961 | 8/1994 | Lidow | 257/341 |

OTHER PUBLICATIONS

French Search Report from French Patent Application 96 09680, filed Jul. 26, 1996.

*Primary Examiner*—Jerome Jackson, Jr.
*Attorney, Agent, or Firm*—Wolf, Greenfield & Sacks, P.C.

[57] ABSTRACT

The present invention relates to a monolithic assembly of a vertical IGBT transistor and a vertical fast diode connected to the drain of the IGBT transistor, implemented in an N-type semiconductor substrate. The rear (or lower) surface of the structure is uniformly formed of a P-type layer having many openings through which the N-type substrate appears. This rear surface is covered with a material for establishing a Schottky contact with the substrate and an ohmic contact with the P-type layer.

9 Claims, 1 Drawing Sheet

MONOLITHIC ASSEMBLY OF AN IGBT TRANSISTOR AND A FAST DIODE

BACKGROUND OF THE INVENTION

1. Field of the Invention

The present invention relates to a monolithic assembly of a fast diode and an IGBT transistor.

2. Discussion of the Related Art

In many circuits, component connections of the type illustrated in FIG. 1 including a MOS power transistor having its drain connected to the anode of a diode can be found. This configuration is notably found in booster circuits such as those used in a.c./d.c. or d.c./d.c. converter circuits. In such applications, the MOS transistor must be able to withstand a relatively high voltage and the diode has to be very fast.

This raises integration problems. Indeed, FIG. 2 shows, in its left portion, a conventional structure of a cell of a vertical MOS transistor and, in its right portion, a conventional structure of a vertical diode. In FIGS. 1 and 2, the gate, the source, and the drain of the MOS transistor, and the cathode of the diode have been referred to by the same references G, S, D, and K, respectively.

For the diode to be fast, its substrate N is doped with gold or platinum or is submitted to another process to increase its speed. Such processes are difficult to perform on a portion of the component only. Thus, if a single component integrating the diode and the MOS transistor is implemented, the processing to increase the speed of the diode reduces the voltage withstanding ability of the high voltage MOS transistor and increases the value of its on-state resistance.

SUMMARY OF THE INVENTION

An object of the present invention is to monolithically implement a diode coupled to a high voltage MOS transistor so as to obtain a fast diode without being prejudicial to the characteristics of the MOS transistor.

U.S. patent application Ser. No. 08/659422 filed Jun. 6, 1996, describes implementation of a fast diode on a same substrate as another vertical component by choosing the fast Schottky/bipolar type diode. This application is incorporated herein by reference. It will be shown that such a structure is particularly well adapted to solving the afore-mentioned problems as it brings specific advantages and a great simplicity of fabrication.

More specifically, a fast diode coupled to a high voltage transistor is achieved by a monolithic assembly of a vertical IGBT transistor and a vertical fast diode connected to the drain of the IGBT transistor. The monolithic assembly is implemented in an N-type semiconductor substrate, wherein the rear (or lower) surface of the structure is uniformly formed of a P-type layer having several openings through which the N-type substrate appears, and wherein this rear surface is covered with a material for establishing a Schottky contact with the substrate and an ohmic contact with the P-type layer.

According to an embodiment of the present invention, the circumference of the structure is occupied by a P-type drive-in.

These objects, characteristics and advantages as well as others, of the present invention, will be discussed in detail in the following non-limiting description of a specific embodiment in relation with the accompanying drawings.

DETAILED DESCRIPTION

Figure 1:
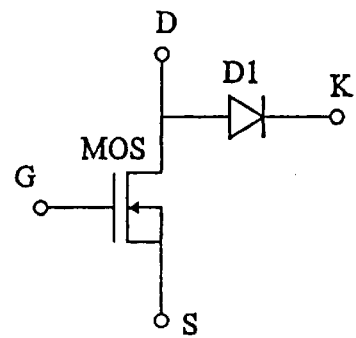
FIG. 1 shows a circuit that includes a MOS transistor and a diode.
Figure 2:
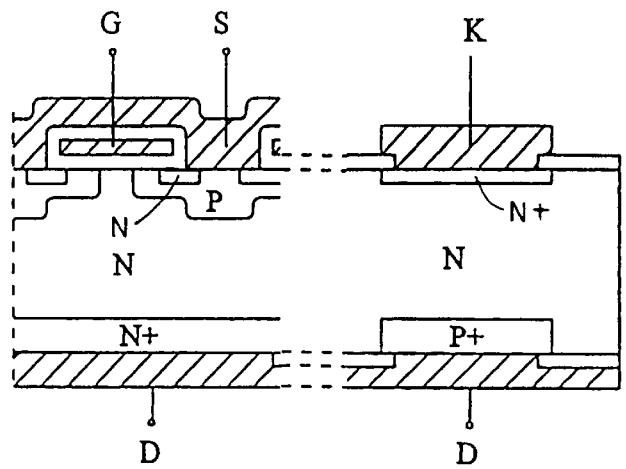
FIG. 2 shows a conventional monolithic embodiment of a MOS transistor and a diode.
Figure 3:
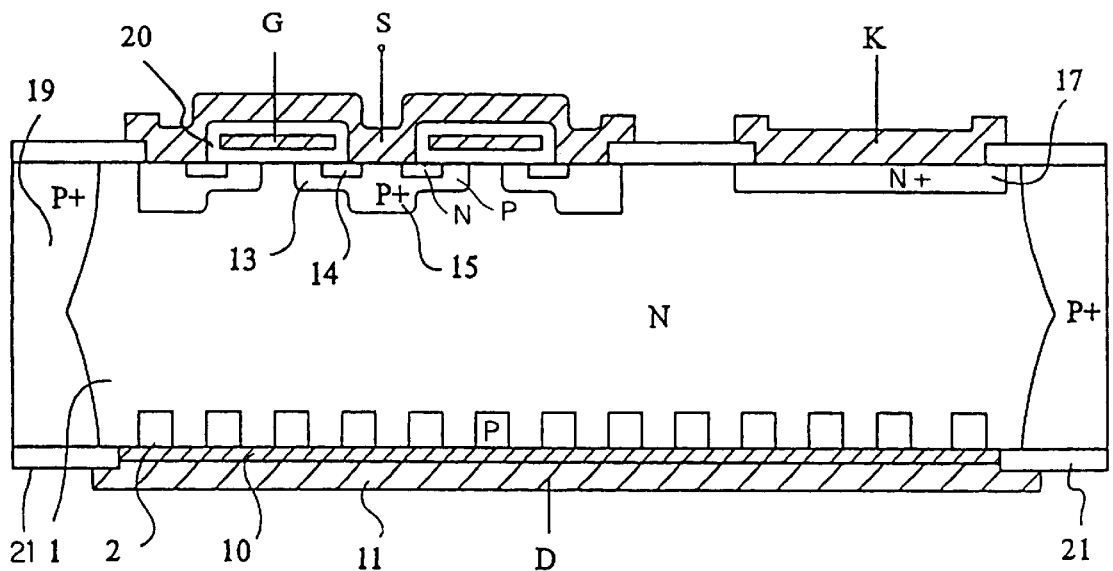
FIG. 3 shows a monolithic assembly according to the present invention of a circuit that includes a fast diode and a high voltage transistor.

The simplified cross-sectional views of FIGS. 2 and 3 are not to scale, as is conventional in the field of the representation of semiconductor components.

According to an aspect of the present invention, an IGBT transistor is substituted for the MOS transistor. It will be shown that this enables a simpler integration. In addition, this substitution enables the circuit to withstand a reverse voltage (whereas a PN diode exists inherently between the source and the drain of a MOS transistor).

As shown in FIG. 3, the present invention provides a structure formed on an N-type substrate 1. In the left portion of the drawing, a vertical IGBT transistor is formed and in the right portion of the drawing, a fast vertical diode is formed.

The rear (or lower) surface of substrate 1 is coated with a P-type layer 2 having a great number of openings. By adjusting the size of the openings, the speed of the diode may be changed. In particular, given a constant total area for the anode of the diode (i.e., the lower right portion of the drawing), the larger the openings, the faster the diode.

This rear surface is coated with a metallization 10 for establishing an ohmic contact with the P-type regions and a Schottky contact with the lightly-doped N-type regions. This metallization 10 is then coated with a metallization 11, for example aluminum.

In the upper portion of the drawing, is a cell of a vertical MOS transistor including a P-type region 13 within which are formed N-type rings 14. The central portion of the P-type region, substantially at the center of rings 14, includes a more strongly doped P-type region 15. Above the portions of region 13 located between the external circumference of rings 14 and the apparent portions of the substrate is formed a gate metallization G separated from the surface of the silicon substrate by a thin oxide layer 20. A metallization S is in contact with the upper surface of at least a portion of N-type rings 14 and central region 15.

Given the presence of the P-type areas of layer 2 on the lower surface of the substrate, this structure operates as an IGBT transistor by injecting charges of minority $P^+$ carriers in the N material, which lowers its resistivity and thus enables an on-state resistance which is much lower than that of a conventional MOS transistor. Conversely, the existence of a Schottky junction between the P-type areas improves the switching of the IGBT transistor. Indeed, the nominal current flowing through the IGBT structure is formed, in this case, partly of charges injected in the Schottky junction (which are not stored since they are majority carriers) and partly of charges injected by the $P^+/N$ junction (which are stored, since they are minority). Compared with a conventional IGBT structure where the $P^+/N$ junction occupies the entire rear surface area, the quantity of charges to be evacuated is much lower and thus, the switching is much faster. It can thus be seen that the integration of a fast diode in a MOS transistor, provided the rapidity of the fast diode is implemented by a Schottky/bipolar diode association, turns this MOS transistor, on the one hand, into an IGBT which results in a gain in silicon surface for an identical on-state resistance, and on the other hand, into a fast IGBT without having to use conventional processings (irradiation, gold or platinum doping) used to reduce the quantity of stored charges.

In the right portion of the drawing, an N+-type region 17 connected to a cathode metallization K of a diode is found at the upper portion of the wafer.

Thus, according to an advantage of the present invention, by virtue of a Schottky/bipolar type configuration on the lower surface, the operation of the diode and the operation of the IGBT transistor are simultaneously improved. Such a structure is easy to manufacture since the same processing is performed on the entire lower surface.

Further shown in FIG. 3 are P+-type drive-ins 19 at the circumference of the device for improving its insulation and its voltage withstanding ability and to avoid any risk of short-circuit in the case where the brazing for attaching the rear surface to a radiator (i.e., heatsink) would overflow laterally.

It should be noted that the drive-ins 19 should not be electrically connected to the Schottky/bipolar anode of the integrated diode, in order to avoid the injection of additional charges. The drive-ins 19 should be isolated with an oxide 21, as is shown in FIG. 3.

Those skilled in the art will note that, in practice, on the upper substrate surface side, a great number of cells 13, 14, 15, will be used to obtain a transistor having the desired power.

Of course, each of the components of the present invention is likely to have various alterations, modifications and improvements currently applied to prior art components of same nature.

It should also be noted that a light doping with metallic ions can be further applied to the structure according to the present invention to further improve its speed.

As an example, a structure according to the present invention can be implemented by using the following data (with $x_j$ referring to a drive-in depth and $C_s$ to a surface concentration):

wafer thickness: between 80 $\mu$m and 240 $\mu$m according to the voltage which covers the range from 600 V to 1200 V, rear surface bipolar Schottky structure: areas of 6 $\mu$m spaced by 6 $\mu$m with $x_j$=5 $\mu$m and $C_s$=5.10$^{18}$, the structures of the front surface are those of a vertical MOS, that is:

$$x_j P^+ = 5 \ \mu m \quad C_s = 1.10^{19}$$
$$x_j P = 3 \ \mu m \quad C_s = 1.10^{17}$$
$$x_j N^+ = 1 \ \mu m \quad C_s = 5.10^{19}$$

gate thickness 500 A, cell size 25 $\mu$m, the surface of the structure is adjusted to withstand a current intensity ranging from 3 A to 50 A according to a density of 2 A/mm$^2$.

Such alterations, modifications, and improvements are intended to be within the spirit and the scope of the present invention. Accordingly, the foregoing description is by way of example only and is not intended to be limiting. The present invention is limited only as defined in the following claims and the equivalents thereto.

What is claimed is:

1. A monolithic assembly of a vertical IGBT transistor and a vertical fast diode connected to a drain of the IGBT transistor, implemented in an N-type semiconductor substrate, wherein a rear surface of the assembly is uniformly formed of a P-type layer having a plurality of openings through which the N-type substrate appears, and wherein the rear surface is covered with a material for establishing a Schottky contact with the substrate and an ohmic contact with the P-type layer and wherein the rear surface extends not only in front of cells of a vertical MOS transistor that is formed in a front surface of the assembly and which constitutes a portion of the vertical IGBT transistor, but also in front of an N+ type region formed on the front surface and constituting a cathode of the diode.

2. An assembly according to claim 1, wherein a circumference of the assembly is surrounded by a P-type peripheral region.

3. A monolithic assembly, comprising:

a vertical IGBT transistor monolithically integrated in an N-type semiconductor substrate, the transistor having gate and source regions formed on an upper surface of the semiconductor substrate and a P-type drain region formed from a P-type layer on a lower surface of the semiconductor substrate;

a vertical fast diode monolithically integrated in the semiconductor substrate, the diode having a cathode region formed on the upper surface of the semiconductor substrate and a P-type anode region formed from the P-type layer on the lower surface of the semiconductor substrate; and a schottky/ohmic metallization coating the lower surface of the semiconductor substrate and a lower surface of the P-type layer, the schottky/ohmic metallization forming a schottky contact with the semiconductor substrate and an ohmic contact with the P-type drain region of the transistor and the P-type anode region of the diode;

wherein the P-type layer includes a plurality of openings through which the schottky/ohmic metallization forms the schottky contact with the semiconductor substrate and the ohmic contact with the P-type drain region of the transistor and the P-type anode region of the diode.

4. The assembly of claim 3, wherein the plurality of openings in the P-type layer are uniformly sized and spaced throughout the P-type layer.

5. The assembly of claim 4, further comprising:

P-type walls surrounding the transistor and the diode;

an oxide layer formed on the lower surface of the semiconductor substrate and contacting the P-type walls; and a lower surface metallization coating the schottky/ohmic metallization and the oxide layer.

6. The assembly of claim 3, wherein the transistor includes:

a first P-type region formed on the upper surface of the semiconductor substrate, a central portion of the first region being more strongly doped than a periphery of the first region;

second N-type regions formed in an upper surface of the periphery of the first region;

an oxide layer, formed on the upper surface of the semiconductor substrate and contacting the semiconductor substrate and a portion of the second regions;

a gate metallization formed on the oxide layer; and a source metallization formed on the upper surface of the semiconductor substrate and contacting the central portion of the first region and a remaining portion of the second regions.

7. The assembly of claim 6, wherein the diode includes:

a third N-type region formed on the upper surface of the semiconductor substrate; and a cathode metallization formed on the upper surface of semiconductor substrate and contacting the third region.

8. The assembly of claim 7, wherein the plurality of openings in the P-type layer are uniformly sized and spaced throughout the P-type layer.

9. The assembly of claim 8, further comprising:

P-type walls surrounding the transistor and the diode;

a second oxide layer formed on the lower surface of the semiconductor substrate and contacting the P-type walls; and a lower surface metallization coating the schottky/ohmic metallization and the second oxide layer.

* * * * *